United States Patent
Boettcher et al.

(10) Patent No.: US 9,735,290 B2
(45) Date of Patent: Aug. 15, 2017

(54) SEMICONDUCTOR DEVICE

(71) Applicant: NXP B.V., Eindhoven (NL)

(72) Inventors: Tim Boettcher, Hamburg (DE); Jan Philipp Fischer, Lueneburg (DE); Thomas Igel-Holtzendorff, Hamburg (DE)

(73) Assignee: Nexperia B.V., Eindhoven (NL)

(*) Notice: Subject to any disclaimer, the term of this patent is extended or adjusted under 35 U.S.C. 154(b) by 0 days.

(21) Appl. No.: 14/984,880

(22) Filed: Dec. 30, 2015

(65) Prior Publication Data

US 2016/0225918 A1 Aug. 4, 2016

(30) Foreign Application Priority Data

Jan. 30, 2015 (EP) .................... 15153336

(51) Int. Cl.
| | | |
|---|---|---|
| *H01L 29/66* | (2006.01) | |
| *H01L 29/861* | (2006.01) | |
| *H01L 29/40* | (2006.01) | |
| *H01L 29/872* | (2006.01) | |
| *H01L 29/06* | (2006.01) | |
| *H01L 29/165* | (2006.01) | |

(52) U.S. Cl.
CPC ...... *H01L 29/8611* (2013.01); *H01L 29/0619* (2013.01); *H01L 29/165* (2013.01); *H01L 29/407* (2013.01); *H01L 29/66136* (2013.01); *H01L 29/66143* (2013.01); *H01L 29/8613* (2013.01); *H01L 29/872* (2013.01); *H01L 29/8725* (2013.01)

(58) Field of Classification Search
CPC . H01L 29/165; H01L 29/872; H01L 29/8611; H01L 29/66136
See application file for complete search history.

(56) References Cited

U.S. PATENT DOCUMENTS

| | | | |
|---|---|---|---|
| 4,982,260 A | 1/1991 | Chang et al. | |
| 2002/0005558 A1 | 1/2002 | Brown et al. | |
| 2011/0215338 A1* | 9/2011 | Zhang ................. | H01L 29/1608 257/73 |

(Continued)

FOREIGN PATENT DOCUMENTS

| | | | |
|---|---|---|---|
| EP | 1 845 561 A2 | 10/2007 | |
| JP | 2010-251482 A | 4/2010 | |

(Continued)

OTHER PUBLICATIONS

Young, G.et al. "Analysis and Optimal Design of a Novel SiGe/Si Power Diode for Fast and Soft Recovery", Chin.Phys. Lett.,vol. 21, No. 2 , pp. 414-417 (2004).

(Continued)

*Primary Examiner* — Trung Q Dang
*Assistant Examiner* — Wasiul Haider
(74) *Attorney, Agent, or Firm* — Ohlandt, Greeley, Ruggiero & Perle, L.L.P.

(57) ABSTRACT

An integrated diode (100) comprising a substrate (102); a Schottky cell (104) on the substrate (102); a heterojunction cell (106) on the substrate (102); a common anode contact (108) for both the Schottky cell (104) and the heterojunction cell (106); and a common cathode contact (110) for both the Schottky cell (104) and the heterojunction cell (106).

7 Claims, 11 Drawing Sheets

(56) References Cited

U.S. PATENT DOCUMENTS

2014/0077230 A1\* 3/2014 Horng ................ H01L 29/8611
                                                                                        257/77
2014/0264369 A1\* 9/2014 Padmanabhan ..... H01L 29/7787
                                                                                        257/76

FOREIGN PATENT DOCUMENTS

| WO | WO 02-063694 A1 | 8/2002 |
| WO | WO 2011-112504 A1 | 9/2011 |

OTHER PUBLICATIONS

Hurkx, G.A.M. et al. "Low-voltage SiGe power diodes", Proc. of the 13th International Symp. on Power Semiconductor Devices and ICs, pp. 239-242 (2001).
Baliga, B. "Analysis of Junction Barrier-Controlled Schottky (JBS) Rectifier Characterisitcs", Solid-State Electronics, vol. 28, No. 11, pp. 1089-1093 (1985).
Extended European Search Report for EP Patent Appln. No. 15153336.1 (Jul. 15, 2015).

\* cited by examiner

SEMICONDUCTOR DEVICE

CROSS-REFERENCE TO RELATED APPLICATIONS

This application claims the priority under 35 U.S.C. §119 of European Patent application no. 15153336.1, filed on Jan. 30, 2015, the contents of which are incorporated by reference herein.

The present disclosure relates to the field of diodes, and in particular a diode comprising a Schottky cell and a heterojunction cell.

According to a first aspect, there is provided an integrated diode comprising:
  a substrate;
  a Schottky cell on the substrate;
  a heterojunction cell on the substrate;
  a common anode contact for both the Schottky cell and the heterojunction cell; and
  a common cathode contact for both the Schottky cell and the heterojunction cell.

Such an integrated diode can provide a low forward voltage drop at both low and high current densities, thereby benefitting from the advantages of both the Schottky cell and the heterojunction cell.

The Schottky cell may be in parallel with the heterojunction cell between the common anode contact and the common cathode contact. The Schottky cell may be adjacent to the heterojunction cell on the substrate. The integrated diode may be a planar device. The heterojunction cell and the Schottky cell may be trench-based devices.

The integrated diode may further comprise a plurality of Schottky cells, and a plurality of heterojunction cells, and optionally a trench having a longitudinal dimension. The plurality of heterojunction cells and the plurality of Schottky cells may be located alternately with respect to each other in a direction that corresponds to the longitudinal dimension of the trench. The plurality of heterojunction cells and the plurality of Schottky cells may be located alternately with respect to each other in a direction that is perpendicular to the longitudinal dimension of the plurality of trenches.

In a direction that is perpendicular to the longitudinal dimension of the plurality of trenches, a trench may be located in between neighbouring heterojunction cells and Schottky cells.

The trench-based device may comprise a reduced surface field effect trench structure. The reduced surface field effect trench structure may comprise at least two trenches that are separated from one another by a joining region of the substrate. The joining region may comprise an electrical contact, a layer of n-doped semiconductor material and a layer of p-doped semiconductor material.

The integrated diode may further comprise a guard collar at the periphery of the heterojunction cell for terminating the heterojunction cell. The guard collar may comprise boron doped silicon.

The heterojunction cell may comprises a layer of p-doped silicon germanium and a layer of n-doped silicon germanium, and may be a silicon-germanium cell. The heterojunction cell may comprise one or more of p-doped silicon germanium, p-doped silicon, p-doped silicon germanium carbide, and p-doped silicon carbide.

The common anode contact and/or the common cathode contact comprise one or more of a metal, an alloy, a silicide, and a disilicide. The common anode contact and/or the common cathode contact comprise:
  a first material for the Schottky cell; and
  a second, different, material for the heterojunction cell.

Embodiments will now be described by way of example, and with reference to the enclosed drawings, in which:
  FIG. 1 shows an example of a hybrid diode;
  FIGS. 2 and 3 show various simulation results;
  FIG. 4 shows an example implementation of a planar hybrid diode;
  FIG. 5 shows an active area of a hybrid diode comprising a Schottky cell and a SiGe cell;
  FIGS. 6a-6e show a processing option for manufacturing a hybrid diode;
  FIGS. 7a-7e show another processing option for manufacturing a hybrid diode;
  FIGS. 8a-8e show a further processing option for manufacturing a hybrid diode;
  FIG. 9 illustrates another example of a planar hybrid diode that includes a Schottky cell and a SiGe cell;
  FIGS. 10a and 10b illustrate an example of the active region of a trench-based hybrid diode;
  FIG. 10c shows a top view of an alternative layout of a trench-based hybrid diode; and
  FIGS. 11a and 11b show the results of simulations that illustrate the influence of the cell dimensions on the planar hybrid diode of FIG. 1.

FIG. 1 shows a diode 100. The diode 100 has a substrate 102, which may be a silicon substrate. A Schottky cell 104 and a heterojunction cell 106 are located on the substrate 102. In this example the Schottky cell 104 is adjacent to the heterojunction cell 106 on the substrate 102. The Schottky cell 104 may have a silicon (Si) Schottky diode structure. The heterojunction cell 106 may be a silicon germanium (SiGe) diode. It will be appreciated that other materials can be used to provide the same functionality.

The diode 100 has a common anode contact 108 for both the Schottky cell 104 and the heterojunction cell 106, and a common cathode contact 110 for both the Schottky cell 104 and the heterojunction cell 106. In this way, the Schottky cell 104 and the heterojunction cell 106 can be considered as being in parallel with each other between the common anode contact 108 and the common cathode contact 110, on a common substrate 102, thereby providing an integrated hybrid device/diode.

A Si Schottky diode can have a relatively high forward voltage drop at high current densities (for example above about 1 A/mm$^2$ of active area). This can be caused by the resistivity of an epitaxial layer and the unipolar nature of carrier transport in the device. At lower current densities, Si Schottky diodes can offer greatly reduced forward voltage drop when compared with pn-junction diodes. In some applications the forward voltage drop at high current densities can be unacceptably high.

SiGe diodes can advantageously have very steep forward current-voltage (I-V) characteristics, which can result in a relatively low forward voltage drop at high current densities (again above about 1 A/mm$^2$ of active area). However, SiGe diodes can show an increased forward voltage drop at lower current densities, when compared to a Si Schottky. This is due to the pn-junction that is used within the heterojunction. The level of the forward voltage drop at lower current densities can be unacceptably high in some applications.

The diode 100 of FIG. 1, which can be considered as a hybrid SiGe/Si Schottky diode, can combine the advantages of both individual technologies. In this way it can be possible to achieve a low forward voltage drop at both low and high current densities. At low current densities, the hybrid diode 100 can behave like a Si Schottky diode, while at high current densities it can exhibit SiGe-like behaviour. This can enable a hybrid diode to operate at higher current densities than a Si Schottky diode, while still achieving low forward voltages.

FIGS. 2 and 3 show the results of simulations that compare the performance of: (i) a hybrid diode such as that illustrated in FIG. 1 (with square symbols in FIGS. 2 and 3); (ii) a PtNi—Si-Schottky diode (with diamond symbols); and (iii) a planar SiGe diode (100 V breakdown voltage) (with triangular symbols).

FIG. 2 shows forward voltage drop on the horizontal axis and forward current density on the vertical axis. It can be seen that at low current densities (less than 1 A/mm$^2$ of active area) the hybrid diode has a forward voltage drop that is significantly lower than the SiGe diode. At high current densities (greater than 1 A/mm$^2$ of active area) the hybrid diode shows a very low forward voltage drop, which is comparable to that of the SiGe diode and is much lower than the Schottky diode. It will be appreciated that a low forward voltage drop can be considered better than a high forward voltage drop.

FIG. 3 shows reverse voltage drop on the horizontal axis and leakage (reverse) current density on the vertical axis. It can be seen that the hybrid diode shows a slightly reduced leakage current when compared with that of the Schottky diode.

The skilled person will appreciate, from the information shown in FIGS. 2 and 3, that the hybrid diode results in reduced power losses when compared with individual Schottky and SiGe diodes.

Examples disclosed herein relate to a device that comprises a regular Si Schottky structure with islands of SiGe epi layer grown selectively in a certain pattern. A metal can be deposited to serve as a Schottky contact on both Si and SiGe cells and to terminate the pn-junction inside the SiGe epi layer. Top metals can be chosen according to specific requirements of an associated package, for example Al for wire bonding and Ni/NiV/NiAg for soft soldering.

FIG. 4 shows an example implementation of a planar hybrid diode 400, which includes an active region 412 located between first termination region 414 and a second termination region (not shown). The termination regions include a Guard Ring structure 415 with a field plate to terminate the active region 412 of the device. Termination regions are well known in the art, and are used to separate active regions of different devices on the same substrate. Termination regions will not be described in detail here.

The portion of the active region 412 that is shown in FIG. 4 includes a first SiGe cell 406, a Schottky cell 404, and a second SiGe cell 423. It will be appreciated that any number of cells can be provided in the active region, in parallel between the metal contacts of the device. In some examples there may be thousands of cells with dimensions of about 2-50 μm. The number and spacing of SiGe and Schottky cells determines the electrical properties of the device, and so it can be considered a design parameter. Spacing between cells of about 10 μm can be used in some examples. Furthermore, as discussed detail below, the cells influence each other, since the SiGe cells can inject holes, which modulate the carrier transport in the Schottky cells. Therefore, having the two types of cells intermixed, and not separated, can provide good operation.

The hybrid diode 400 of FIG. 4 includes the following layers:
- a substrate 402, which may be a silicon substrate;
- an epilayer 416, which may be a silicon epilayer, on top of the substrate 402;
- a first SiGe layer 414, which forms part of the first SiGe cell 406, on top of the epilayer 416;
- a second SiGe layer 424, which forms part of the second SiGe cell 423, on top of the epilayer 416;
- a Schottky contact layer 418 on top of (i) the first SiGe layer 414, (ii) the second SiGe layer 424, and (iii) the regions of the epilayer 416 that are not covered by the first SiGe layer 414 and the second SiGe layer 424; the Schottky and SiGe cells can be arranged in an array of several repeating cells. The Schottky contact layer 418 can for example be formed by a metal silicide or an alloy such as WTiN;
- a contact metal stack layer 420, for example TiAl; and
- a second metal stack layer 422, for example TiNi, for wire bonding/clip soldering.

FIG. 5 shows an active area of a hybrid diode comprising a Schottky cell 504 and a SiGe cell 506. A silicide layer 518 is provided on top of a Si epilayer 516 in the Schottky cell 504.

The SiGe cell 506 includes an n-doped SiGe layer 514b on top of the Si epilayer 516, and a p-type SiGe layer 514a on top of the n-doped SiGe layer 514b. The n-doped SiGe layer 514b and the p-type SiGe layer 514a together define the pn-junction of the SiGe cell 506, and can be considered as sub-layers of the SiGe layer that is described with reference to FIG. 4. The silicide layer 518 is provided over the top of the p-type SiGe layer 514a and also down the sides of the n-doped SiGe layer 514b and the p-type SiGe layer 514a in order to terminate the pn-junction, as discussed above.

A guard collar 526 is shown in the example of FIG. 5. The guard collar 526 provides termination for the heterojunction of the SiGe cell 506. The guard collar 526 is in the Si epilayer 516 underneath the n-doped SiGe layer 514b. In the plane of the n-doped SiGe layer 514b, the guard collar 526 extends inwards from an outer edge of the n-doped SiGe layer 514b for a short distance, for example of the order of 100 nm. The guard collar 526 is positioned at the periphery of the SiGe cell 506 such that it protects the boundary between the SiGe and the Schottky cells from leakage currents.

The active area of the hybrid diode of FIG. 5 can be constructed by growing a thin SiGe layer epitaxially, either selectively or non-selectively (and structured in the latter case). Subsequently, a metal is applied which serves as a Schottky contact on both the Si Schottky cell 504 and the SiGe cell 506. The edges of the SiGe cell 506 can further be protected by a shallow p-implant (the guard collar 526).

It will be appreciated that there are a number of different options for creating a Schottky contact on the Si Schottky cell 504 and the SiGe cell 506. A metal can be deposited and structured such that a silicide is created only in the Si areas but not in the SiGe cells. Afterwards another metal (such as WTiN) can be applied to contact both the Si Schottky cell 504 and the SiGe cell 506. Another alternative is to deposit a metal, such as WTiN, over the whole active area such that it serves as a Schottky contact on both the SiGe cells 506 and the Si Schottky cells 504. A further still alternative is to form a silicide on both the Si Schottky cell 504 and the SiGe cell 506. In this case, an additional Si cap layer can be grown on the SiGe cell 506, which can serve as a sacrificial layer in the silicide formation process (e.g. with Co, Ni, NiFe, PtNi). In principle, different silicides can be formed on the Si Schottky cell 504 and the SiGe cell 506 by two subsequent deposition and silicide formation steps. That is, the common anode contact and or the common cathode contact may comprise a first material for the Schottky cell 504, and a second material for the SiGe heterojunction cell 506. In this way, many different combinations of barrier heights on the SiGe and Si cells can be implemented such that the performance of the device can be tuned to a specific application.

It has been found that by placing the Si Schottky cell 504 and the SiGe cell 506 on a common substrate/in the same integrated device, the two cells can be thermally coupled in an advantageous way. For example, heat generated by the Si Schottky cell 504 can be absorbed by the SiGe cell 506, thereby cooling the Si Schottky cell 504.

Also, the overall current density of the hybrid diode can advantageously be relatively high. This can be due to current modulation into the epilayer, as a result of hole injection from the p-type SiGe layer 514a.

A non-limiting number of processing options for manufacturing a hybrid diode will now be described with reference to FIGS. 6a-6e, 7a-7e, and 8a-8e.

In the example of FIGS. 6a-6e:

Figure 6A:
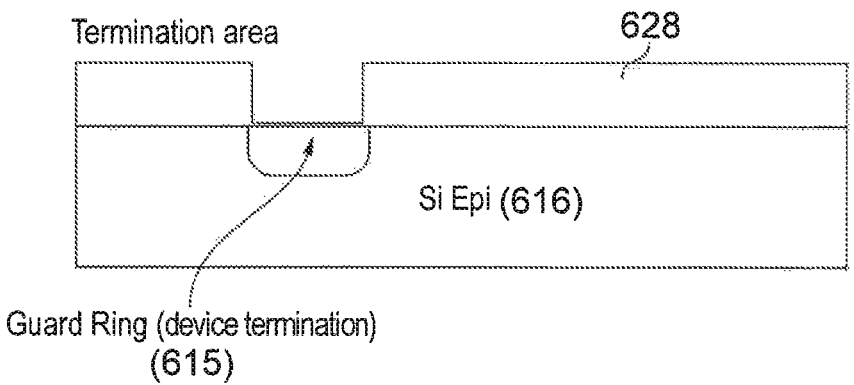
FIG. 6a shows that a thermal oxide 628 is opened (wet or dry etch) and a scattering oxide is grown to implant the guard ring 615 (device termination), which in this example is a Boron implant on the order of $1E13/cm^2$.
Figure 6B:
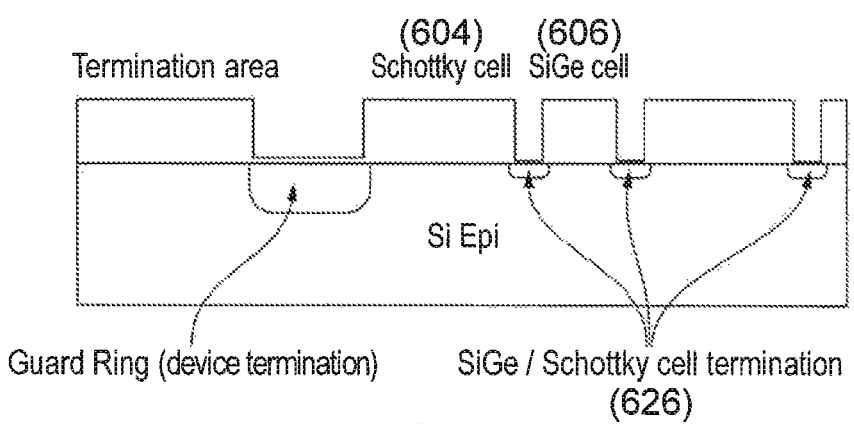
FIG. 6b shows that, with an additional mask, an opening for the termination between SiGe 606 and Schottky 604 areas (guard collar 626) is etched (dry etch), a scattering oxide is grown, and a high dose of Boron ($1E14 \ldots 1E15/cm^2$) is implanted.
Figure 6C:
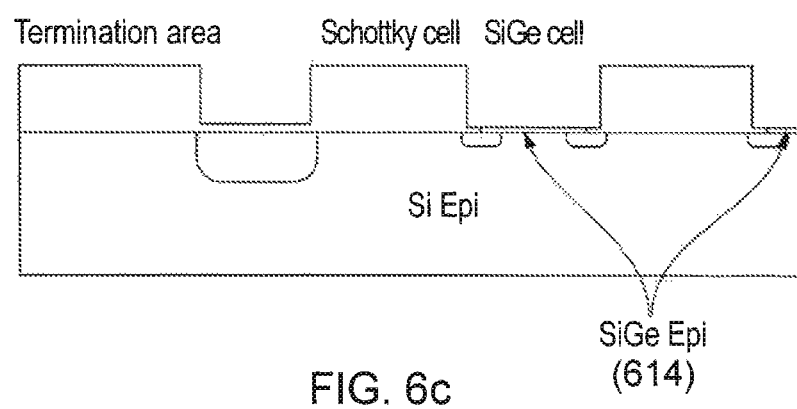

Afterwards, in FIG. 6c, the thermal oxide 628 in the SiGe cell is dry-etched by using another mask. The SiGe epitaxial layer is then grown selectively in the oxide window.

Figure 6D:
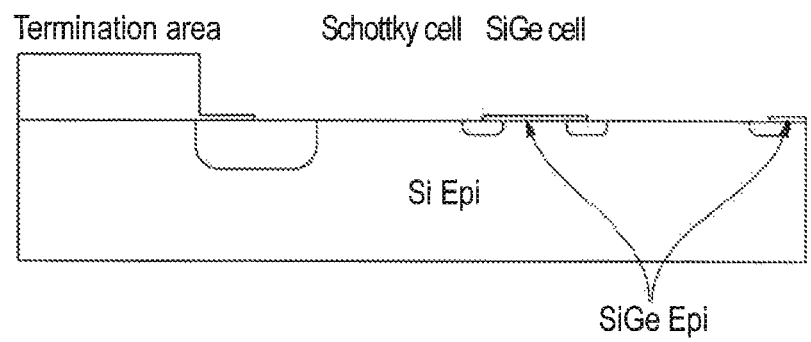

In FIG. 6d, the remaining oxide inside the diode active area has been etched (wet).

Figure 6E:
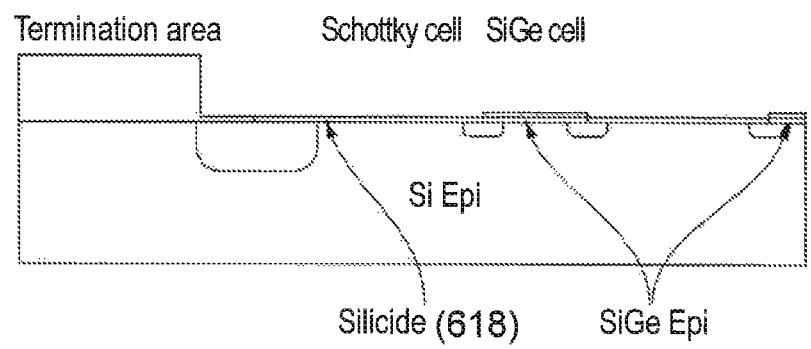

In FIG. 6e, a metal is deposited and a Silicide 618 is formed in a rapid thermal processing (RTP) step.

The processing illustrated by FIGS. 6a-6e can be considered advantageous because it creates a well-defined termination between the cells.

Figure 7A:
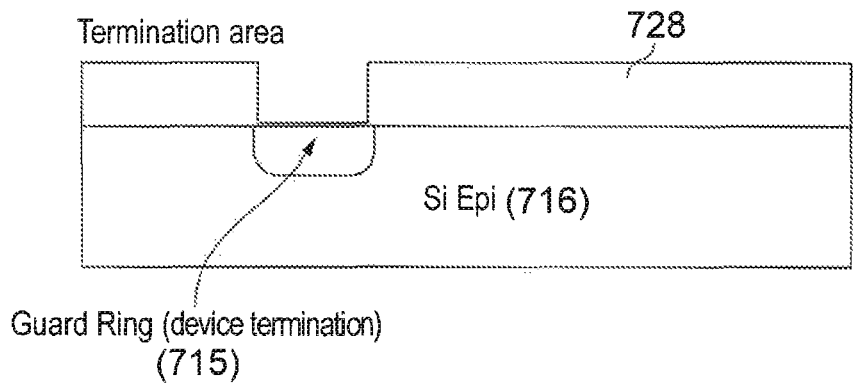

In the example of FIGS. 7a-7e:

FIG. 7a shows that a thermal oxide 728 is opened (wet or dry etch) and a scattering oxide is grown to implant the guard ring 715 (device termination), which in this example is a Boron implant on the order of $1E13/cm^2$.

Figure 7B:
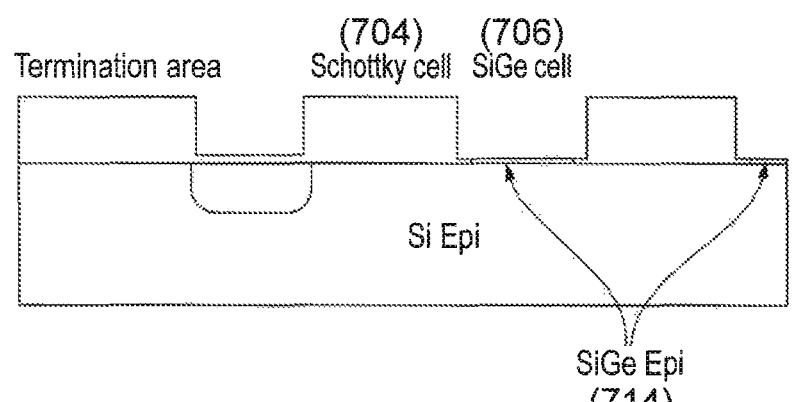

In FIG. 7b, a contact window for the SiGe cell 706 is opened, and the SiGe epitaxial layer 714 is grown selectively.

Figure 7C:
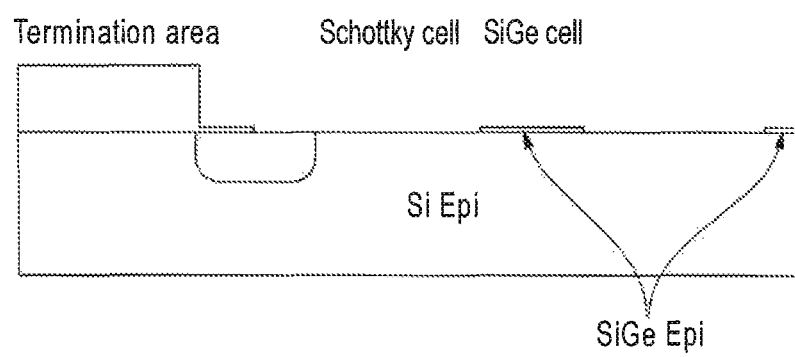

Afterwards, in FIG. 7c, the remaining thermal oxide in the diode active area is wet-etched.

Figure 7D:
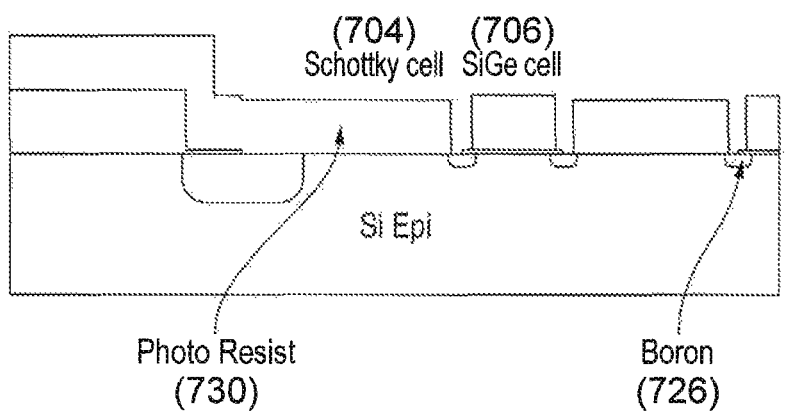

In FIG. 7d, a photo resist mask layer 730 is applied, and Boron 726 is implanted directly through the resist mask 730 to terminate the interface between the SiGe cell 706 and the Schottky cell 704.

Figure 7E:
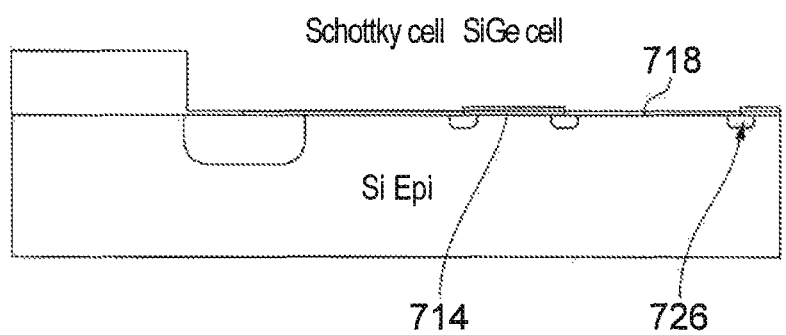

In FIG. 7e, the resist is stripped (wet etch), and a short temperature step on the order of 450° C. or above is applied to activate the Boron 726. The thermal budget should remain low enough to not relax the strained SiGe layer 714. Subsequently, a metal can be deposited and a Silicide 718 can be formed, in a similar way to that described with reference to FIG. 6e. Alternatively, the Boron activation and Silicide formation can be achieved as a single process step.

Figure 8A:
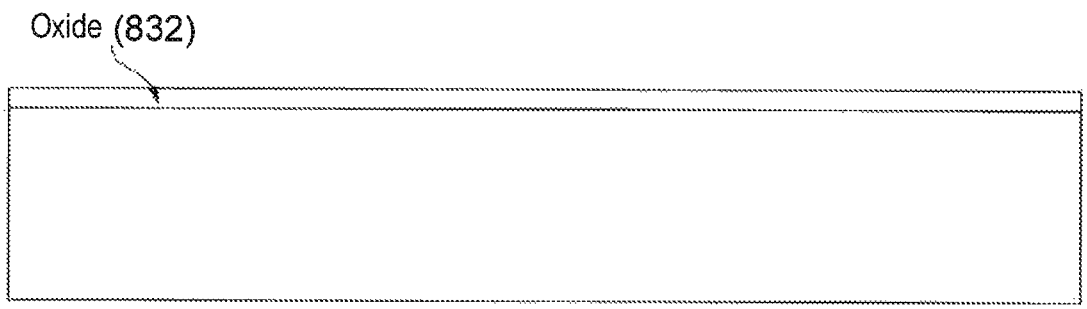

In the example of FIGS. 8a-8e:

In FIG. 8a, the diode is diffused until CO etching (everything described here happens inside the contact open (CO) window). An oxide hardmask 832 is formed.

Figure 8B:
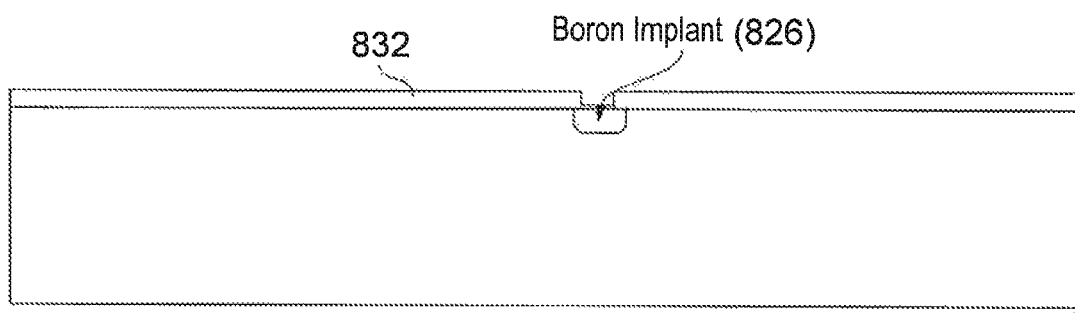

In FIG. 8b, the oxide hardmask 832 is etched (dry etch), a thin Scattering Oxide is grown, and a guard collar is implanted and diffused.

Figure 8C:
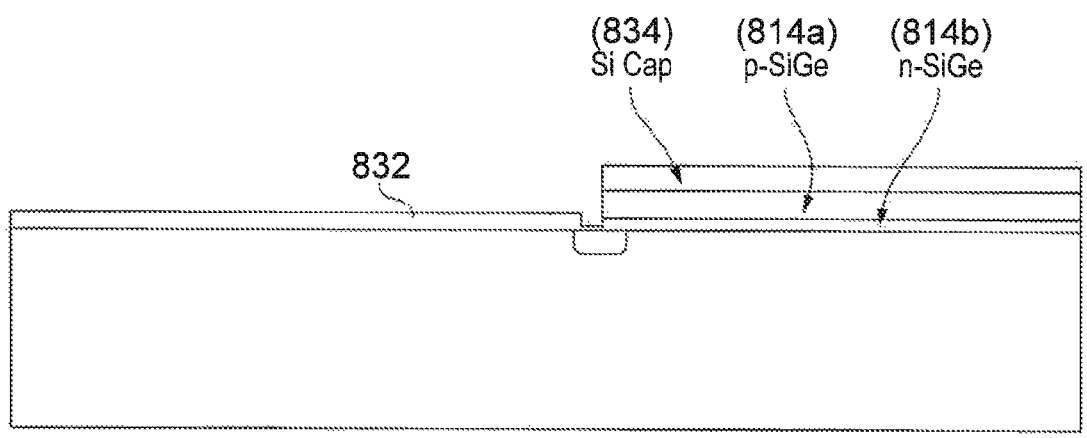

In FIG. 8c, the oxide 832 is opened for the SiGe cell and SiGe to be selectively grown. More particularly, an n-doped SiGe layer 814b is grown, a p-type SiGe layer 814a is grown on top of the n-doped SiGe layer 814b, and a Si cap layer 834 is grown on top of the a p-type SiGe layer 814a. The Si cap layer 834 is a sacrificial layer for the silicide formation.

Figure 8D:
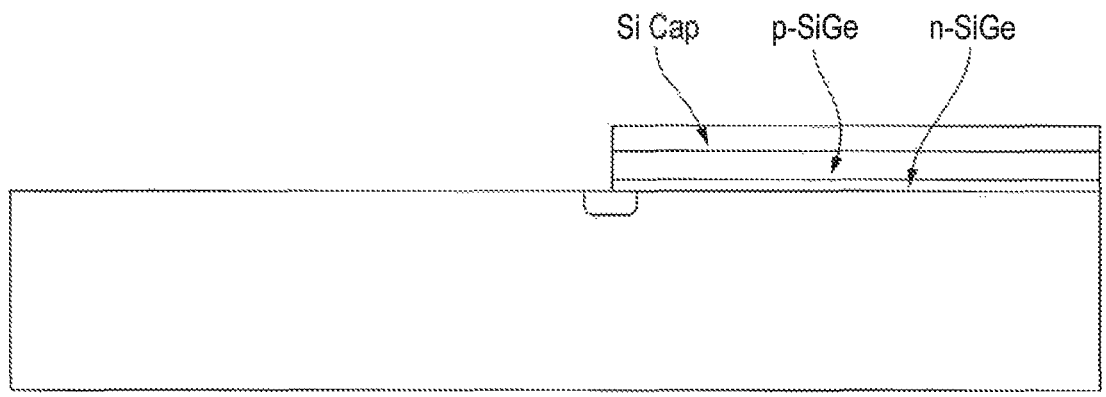

In FIG. 8d, the remaining oxide is dipped.

Figure 8E:
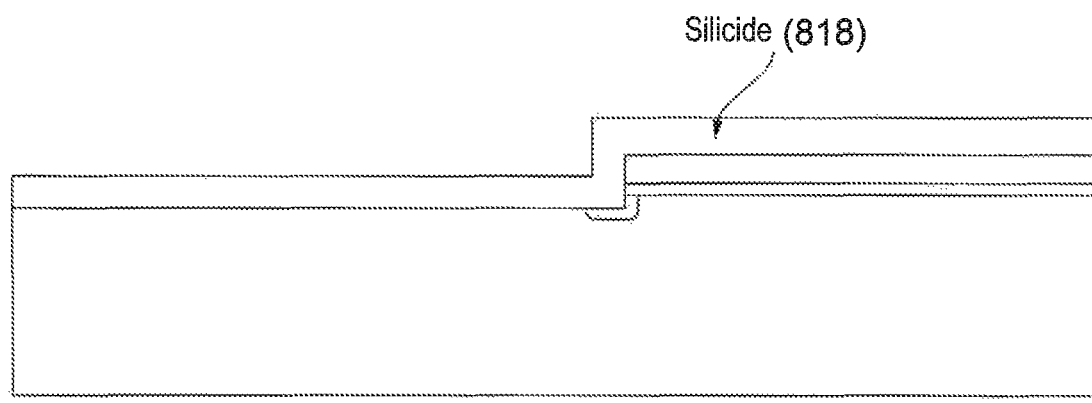

In FIG. 8e, metal is deposited and silicide 818 is formed.

The choice of fabrication process may depend on the device and process architecture. Each variant has its own advantages.

Figure 9:
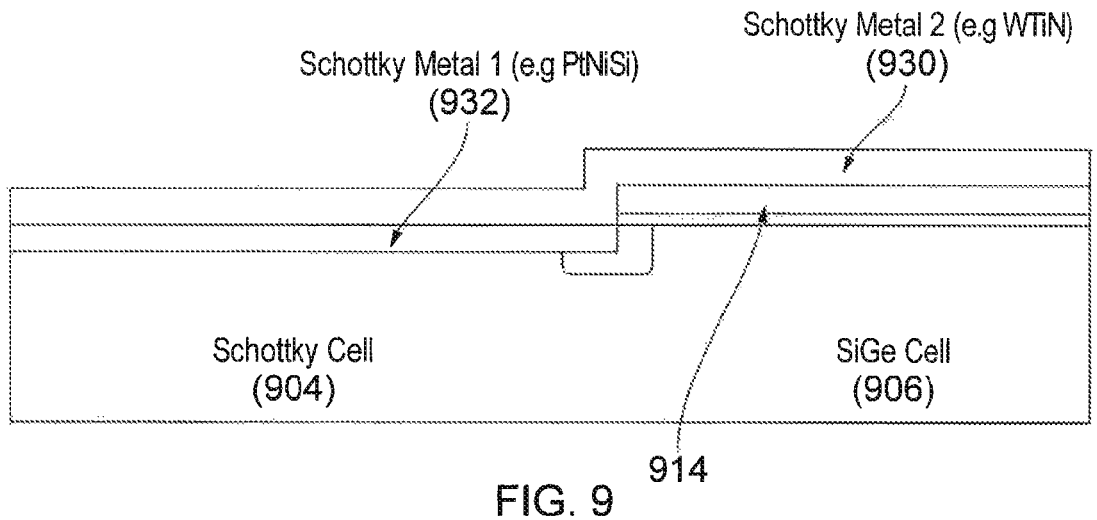
Figure 10A:
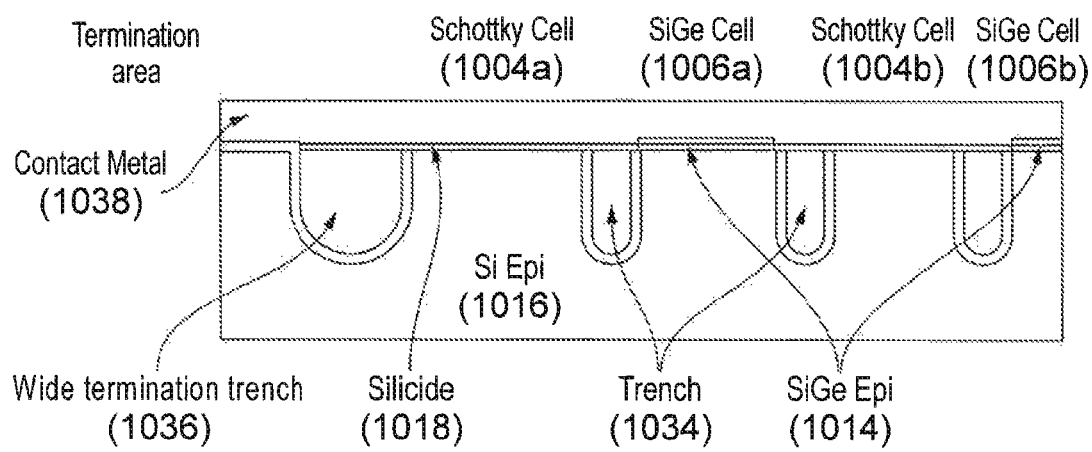
Figure 10B:
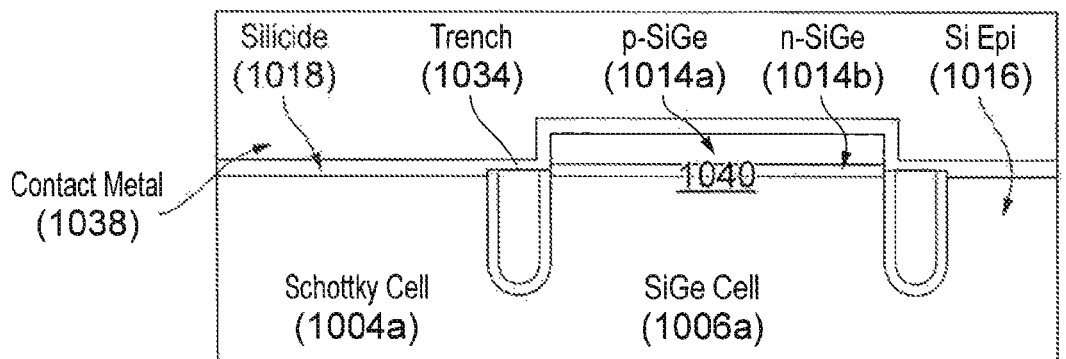

FIG. 9 illustrates another example of a planar hybrid diode that includes a Schottky cell 904 and a SiGe cell 906. FIG. 9 illustrates how different Schottky metals can be used for the SiGe cell 906 and on the Schottky cell 904. In this example, a first Schottky metal of PtNiSi is used for the Schottky cell 904 and a second Schottky metal of WTiN is used for the SiGe cell 906. Use of different Schottky metals can improve the leakage current of the hybrid diode. The hybrid diode can have a silicide in the Schottky cell 904 and a metal contact on the SiGe cell 906, or vice versa FIGS. 10a and 10b illustrate an example of the active region of a trench-based hybrid diode. FIGS. 10a and 10b show a Si epi layer 1016. A wide termination trench 1036, a first Schottky cell 1004a, a first SiGe cell 1006a, a second Schottky cell 1004b and a second SiGe cell 1006b are provided in/on the Si epi layer 1016. FIG. 10b shows the first Schottky cell 1004a and the first SiGe cell 1006a in more detail. One or more examples disclosed herein involve the use of a modified RESURF trench structure in other types of diode, in particular, silicon germanium diodes.

The active region of each SiGe cell 1006 has a RESURF trench structure comprising two trenches 1034 formed in the Si epi layer 1016 and separated from one another by joining regions 1040 of the substrate Si epi layer 1016. In this example the Si epi layer 1016 is an n-doped epitaxial layer of monocrystalline silicon located on top of a supporting substrate (not shown), and the joining regions 1040 are mesa regions of this monocrystalline silicon layer 1016. The term "mesa" may be taken to mean a region of the Si epi layer 1016 having a substantially flat top and one or two (depending on whether it is located adjacent to or between the trenches, respectively) relatively steep sides. Each mesa/joining region 1040 comprises an electrical contact 1038, an epitaxial layer of n-doped semiconductor material 1014b in addition to a layer of p-doped semiconductor material 1014a such that a p-n junction is formed within the mesa region(s). The p-n junction can be formed on the upper surface of the monocrystalline silicon substrate 1016. For example, the epitaxial semiconductor may comprise a layer of p-doped semiconductor material (such as p-doped silicon germanium 1014a) formed directly on top of the layer of n-doped semiconductor material (such as n-doped silicon germanium 1014b).

By positioning the electrical contact 1038 and the p-n junction at the mesa regions 1040 between adjacent trenches 1034, electrically conductive material deposited within the trenches 1034 can be used to influence the electric field within the mesa regions 1040 to control the electrical properties of the SiGe cell 1006.

A Schottky Contact layer 1018 is provided over the top of the p-doped semiconductor material (p-SiGe layer) 1014a, and the electrical contact 1038 is provided on top of the Schottky Contact layer 1018. In this example the Schottky Contact layer 1018 is a silicide layer.

To achieve a sufficiently low band gap, the epitaxial layer(s) of semiconductor material 1014a, 1014b (p-doped and n-doped) should be at least partially (and in some examples fully) strained. The term "strained" means that the epitaxial layers of semiconductor material have become elastically deformed in order to adapt to the different lattice constant of the underlying substrate without the formation of crystal defects. If the layers are too thick, however, the strain can relax and defects can start to hamper the functionality of the SiGe cell 1006. This is because the built-in energy of a layer increases with thickness until it becomes energetically favourable to incorporate defects to release the strain, which also changes the band gap of the silicon germanium. The optimum thickness of the p-doped and n-doped layers 1014a, 1014b will depend on the stoichiometry of the material (for example, the germanium fraction in silicon germanium), but in general for some applications, the combined thickness should not exceed 40 nm. In this respect, the layer of p-doped semiconductor 1014a may have a material thickness of 10-30 nm (in some examples about 20 nm) and the underlying layer of n-doped semiconductor material 1014b may have a material thickness of no more than 10 nm (in some examples about 5 nm).

In the examples described herein, the trenches are lined with a layer of electrically insulating material (such as silicon oxide) and at least partially filled with an electrically conductive material (such as polycrystalline silicon) to enable them to influence the electric field in the mesa region 1040 located therebetween.

On top of the monoctystalline silicon substrate (the Si epi layer) 1016 in each Schottky cell 1004a, 1004b is the silicide layer 1018. On top of the silicide layer 1018 is the electrical contact (contact metal) 1038. The silicide layer 1018 and the contact metal 1038 is common to all of the Schottky cells 1004a, 1004b and also to all of the SiGe cells 1006a, 1006b in the hybrid diode. Alternatively, as mentioned above, different silicides could be used in the SiGe and Schottky cells, or a silicide can be used in the Schottky cell and a metal can be used in the SiGe cell, or vice versa.

The silicide layer 1018 is provided over the top of the p-SiGe layer 1014a in the SiGe cell 1006a, and the contact metal 1038 is provided on top of the silicide 1018 layer.

Optionally, the silicide in any of the examples disclosed herein can be annealed to form a disilicide. The disilicide formation can significantly slow down, or stop, at the interface of cap layer and p-SiGe. The monosilicide formation does not. Therefore, in order to have a controlled process not consuming the p-SiGe layer, it can be advantageous to first create a monosilicide (consuming only part of the cap layer), and then turn it into a disilicide (consuming the remaining cap layer and stopping on the p-SiGe). Further details of an example of how to form a disilicide are provided in European patent application 13187183.2, the contents of which are incorporated herein by reference.

The trenches 1034 may also be referred to as trench stripes that are generally parallel with each other. In the example of the FIGS. 10a and 10b, the cells are arranged as stripes parallel to the longitudinal dimension of the trench stripes. That is, a plurality of SiGe cells 1006 and a plurality of Schottky cells 1004 are located alternately with respect to each other in a direction that is transverse to, is perpendicular to, a longitudinal dimension of the trenches. When considered in a direction that is perpendicular to the longitudinal dimension of the trenches 1034, a trench 1034 is located in between neighbouring SiGe cells 1006 and Schottky cells 1004.

For the trench-based examples, the required spacing can be determined in accordance with the RESURF effect. That is, it can be defined by the target voltage, the epi layer doping etc., as known in the art. Scaling can be of the order of 2-10 μm.

Figure 10C:
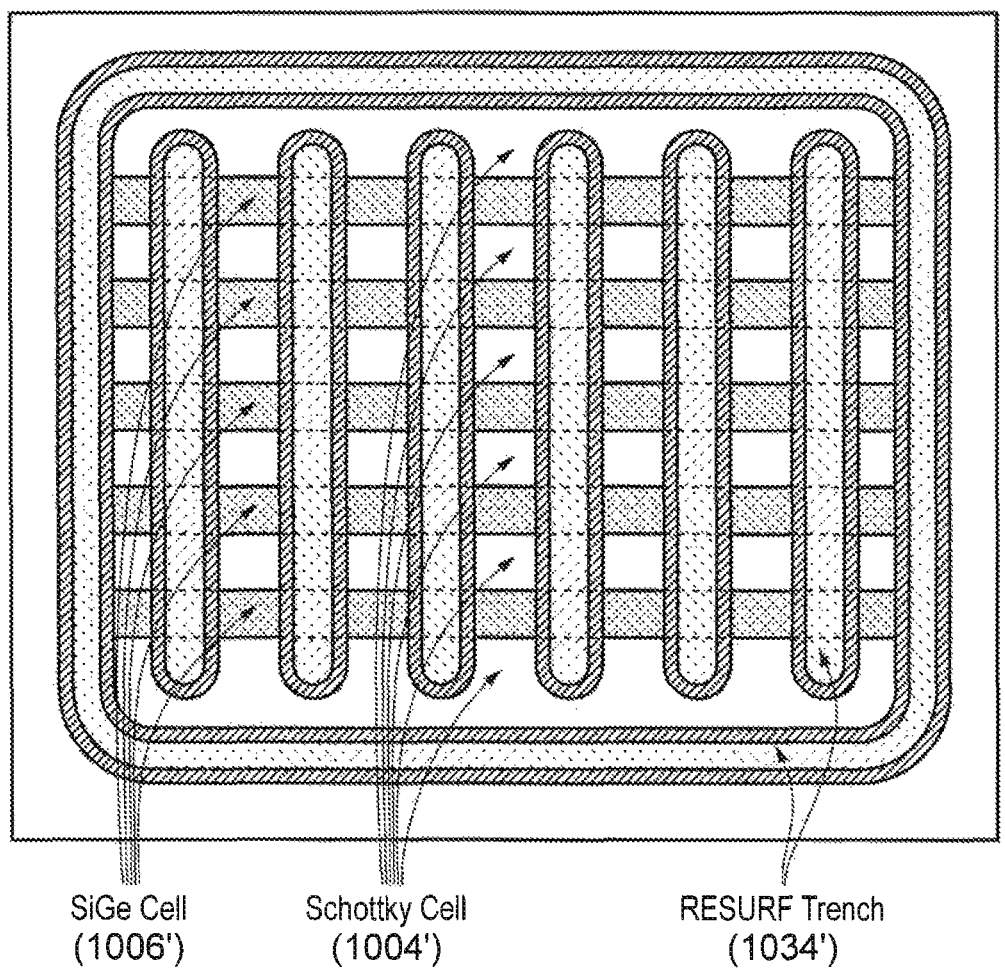

FIG. 10c shows a top view of an alternative layout of a trench-based hybrid diode. In this example, the SiGe cells 1006' and the Schottky cells 1004' are arranged as stripes perpendicular to a longitudinal dimension of the trenches 1034'. That is, a plurality of SiGe cells 1006' and a plurality of Schottky cells 1004' are located alternately with respect to each other in a direction that corresponds to, is parallel with, the longitudinal dimension of the trench. The layout of FIG. 10c may be simplify the required processing because the boundary region of SiGe and Schottky cells is not within the trench and therefore it may be easier to align lithographically in the fabrication process.

Figure 1:
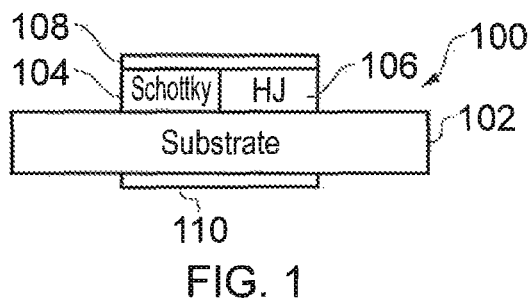
Figure 2:
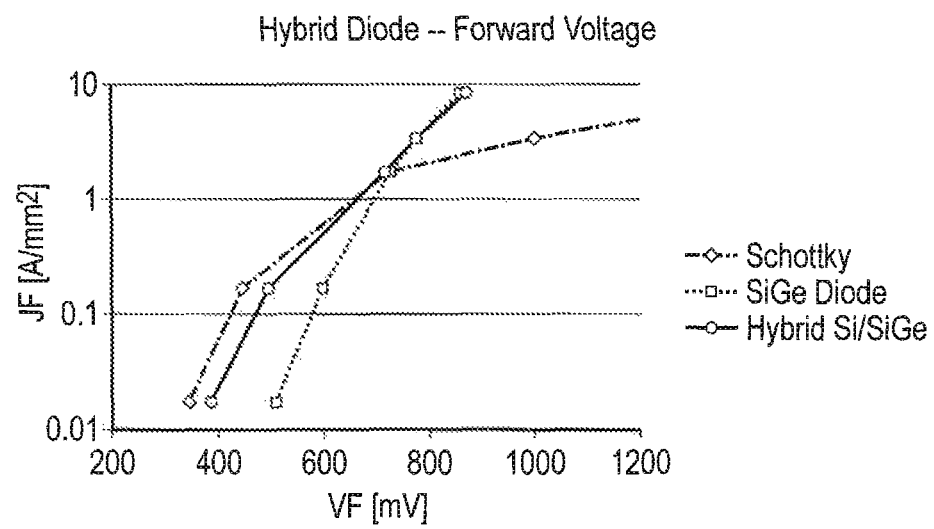
Figure 3:
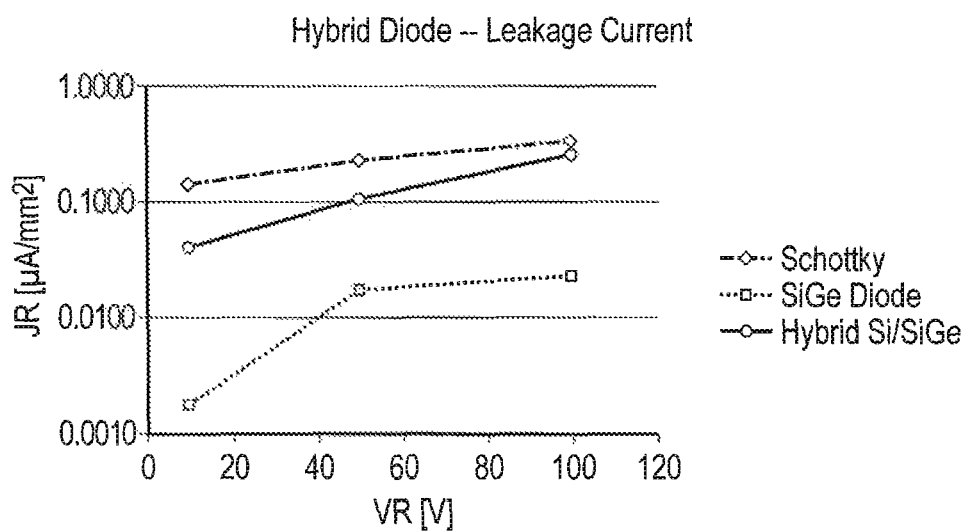
Figure 4:
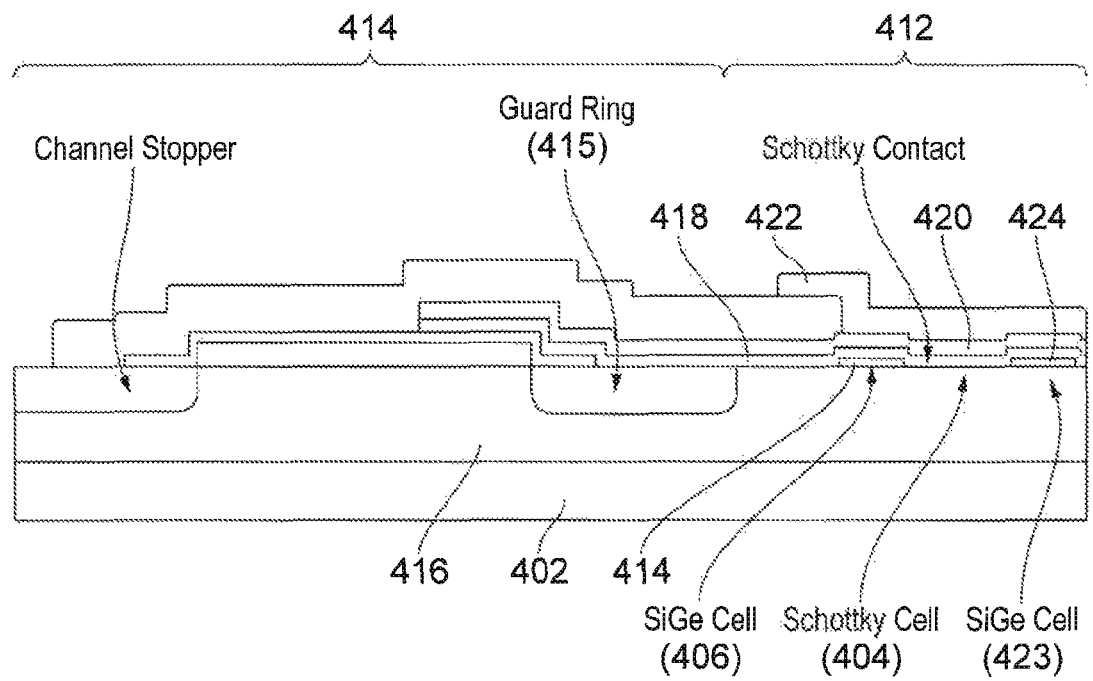
Figure 5:
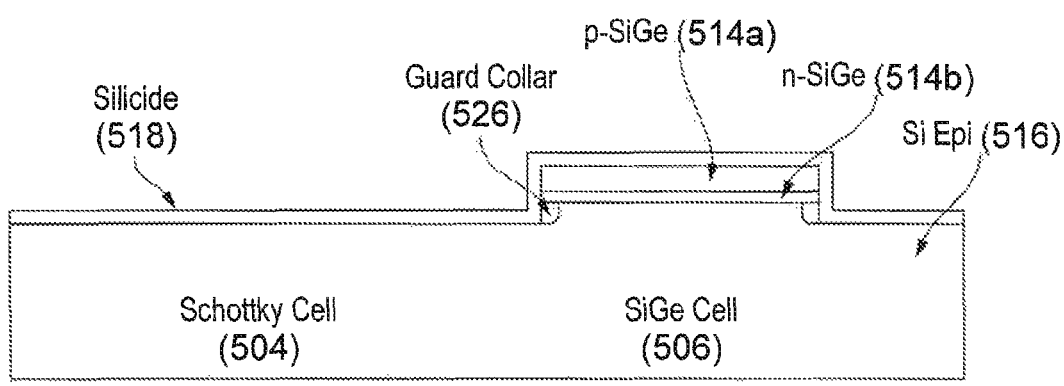
Figure 11A:
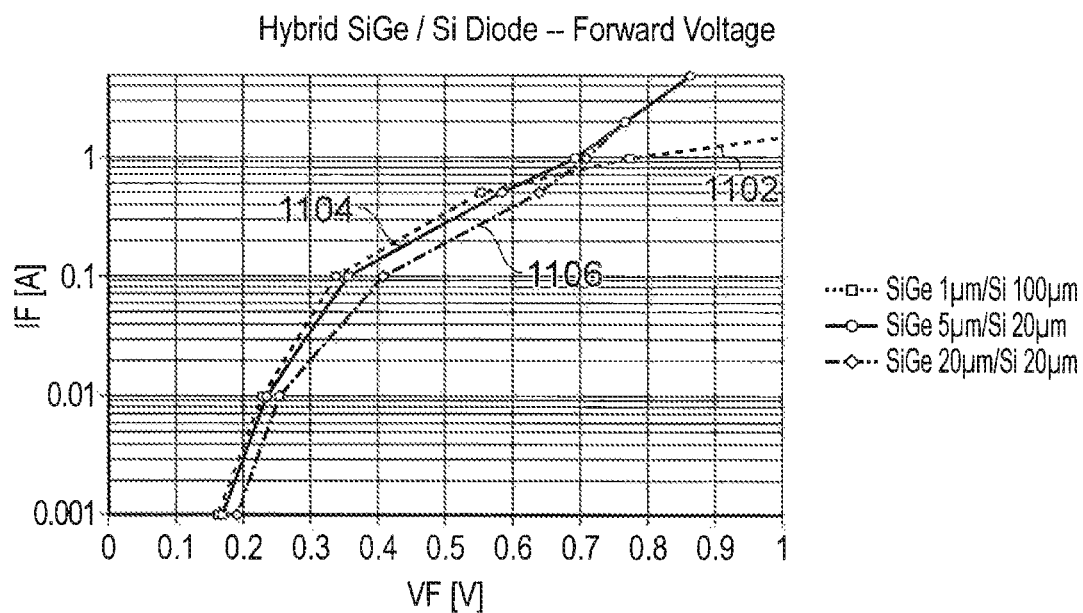
Figure 11B:
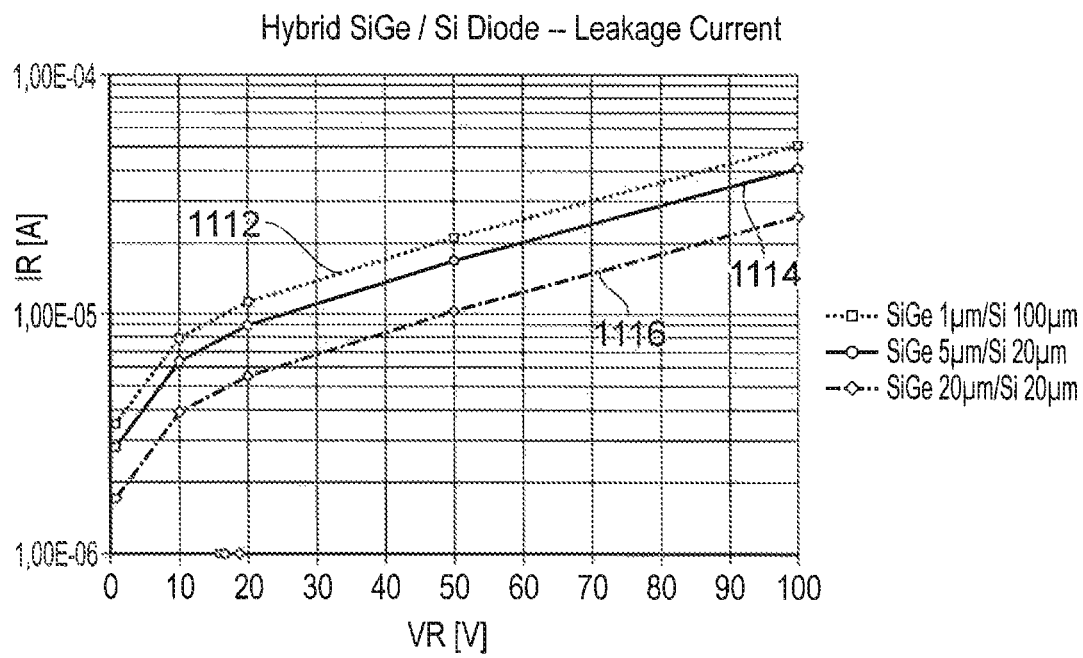

FIGS. 11a and 11b show the results of simulations that illustrate the influence of the cell dimensions on the planar hybrid diode of FIG. 1, where the SiGe cell is contacted by a PtNi silicide and the Si cell is contacted by a WTi silicide.

FIG. 11a shows forward voltage drop on the horizontal axis and forward current on the vertical axis. The following plots are shown in FIG. 11a:

| Plot Number | SiGe cell dimensions (μm) | Si cell dimensions (μm) |
|---|---|---|
| 1102 | 1 | 100 |
| 1104 | 5 | 20 |
| 1106 | 20 | 20 |

FIG. 11b shows reverse voltage on the horizontal axis and reverse leakage current on the vertical axis. The following plots are shown in FIG. 11b:

| Plot Number | SiGe cell dimensions (μm) | Si cell dimensions (μm) |
|---|---|---|
| 1112 | 1 | 100 |
| 1114 | 5 | 20 |
| 1116 | 20 | 20 |

One or more examples disclosed herein relate to a hybrid diode, which merges SiGe and Si Schottky technology into one device. The combination can provide improved leakage current properties of the Schottky diode and reduced forward voltage drop at low and high current densities in a single device. This advantage can be used to offer thermally stable diodes with reduced forward voltage, or it can be used to reduce the chip size for the same level of performance.

It will be appreciated that any components that are described or illustrated herein as being coupled or connected could be directly or indirectly coupled or connected. That is, one or more components could be located between two components that are said to be coupled or connected whilst still enabling the required functionality to be achieved.

The invention claimed is:
1. An integrated diode comprising:
   a substrate;
   a Schottky cell on the substrate;
   a heterojunction cell on the substrate;
   a common anode contact for both the Schottky cell and the heterojunction cell;

a common cathode contact for both the Schottky cell and the heterojunction cell; and a guard collar positioned at the periphery of the heterojunction cell and between the Schottky cell and the heterojunction cell for terminating the heterojunction cell with respect to the Schottky cell.

2. The integrated diode of claim 1, wherein the Schottky cell is in parallel with the heterojunction cell between the common anode contact and the common cathode contact.

3. The integrated diode of claim 1, wherein the Schottky cell is adjacent to the heterojunction cell on the substrate.

4. The integrated diode of claim 1, wherein the integrated diode is a planar device.

5. The integrated diode of claim 1, wherein the guard collar comprises boron doped silicon.

6. The integrated diode of claim 1, wherein the common anode contact and the common cathode contact comprise one or more of a metal, an alloy, a silicide, and a disilicide.

7. The integrated diode of claim 1, wherein the common anode contact and/or the common cathode contact comprise:

a first material for the Schottky cell; and a second, different, material for the heterojunction cell.

* * * * *